(12) United States Patent
Liu et al.

(10) Patent No.: US 6,753,646 B1
(45) Date of Patent: *Jun. 22, 2004

(54) FLUORESCENT POWDER FOR FABRICATING HIGH BRIGHTNESS WHITE LIGHT EMITTING DIODES

(75) Inventors: Ru-Shi Liu, Hsinchu Hsien (TW); Yi-Shan Lin, Nan Tou Hsien (TW); Liang-Sheng Chi, Yun-Lin Hsien (TW); Chien-Yuan Wang, Kaohsiung Hsien (TW)

(73) Assignee: Lite-On Technology Corporation, Taipei (TW)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 10/336,007

(22) Filed: Jan. 3, 2003

(30) Foreign Application Priority Data

Dec. 3, 2002 (TW) .................................. 91135089 A

(51) Int. Cl.$^7$ .................................................. H01J 1/62
(52) U.S. Cl. ....................... 313/512; 313/486; 313/503
(58) Field of Search ................................ 313/512, 503, 313/486; 252/500

*Primary Examiner*—Vip Patel
(74) *Attorney, Agent, or Firm*—Birch, Stewart, Kolasch & Birch, LLP

(57) ABSTRACT

A fluorescent material with formula $(Y_xM_yCe_z)Al_5O_{12}$, where $x+y=3$, $x$, $y \neq 0$, $0 < z < 0.5$, M is selected from the group consisting of Tb, Lu, and Yb. The fluorescent material has a host $(Y_xM_y)Al_5O_{12}$ and an activator: Ce. By changing the composition of metals in the host, the crystal field thereof can be modulated, thereby altering the interaction force between the activator and the other components, and changing the wavelength of emitted colors.

The present invention provides a white light-emitting device comprising a light emitting diode and above-mentioned. fluorescent powder. The LED emits purple-blue or blue light having a domination wavelength $\lambda D$ range from 430 nm to 500 nm. The fluorescent powder is excited by the purple-blue or blue. light emitted from-the LED to generate green-yellow light to orange-yellow light having a wavelength range from 560 nm to 590 nm and mixed with the light of LED to form white light.

9 Claims, 3 Drawing Sheets

FLUORESCENT POWDER FOR FABRICATING HIGH BRIGHTNESS WHITE LIGHT EMITTING DIODES

BACKGROUND OF THE INVENTION

1. Field of the Invention

The present invention relates to a fluorescent material for fabricating high brightness white light emitting diodes. More particularly, the present invention relates to a fluorescent material having a formula $(Y_xM_yCe_z)Al_5O_{12}$, in combination with purple-blue light or blue light emitting diodes, for generating a high brightness white light emitting diode device.

2. Description of the Prior Art

In 1996, a Japanese company, Nichia Kagaku Kogyo Kabushiki Kaisha (Tokushima), which is also known as "Nichia Chemical" on the market, disclosed a method for generating white light by using a blue light emitting diode (LED) that emits blue light absorbed by a fluorescent material to emit yellowish light. The yellowish light is diffused and mixed with blue light to eventually generate high brightness white light. This new technique has ushered a new era of white LED illumination and is believed that will soon replace the conventional fluorescent lamps in the near future. In Taiwan Patent No. 1,561,77I and also in U.S. Pat. No. 5,998,925, assigned to Nichia Kagaku Kogyo Kabushiki Kaisha, disclose a yellow light YAG:Ce fluorescent powder, which has a general formula $(Y_{l-p-q-r}Gd_pCe_q Sm_r)_3(Al_{l-s} Ga_s)_5O_{12}$, where $0 \leq p \leq 0.8$, $0.003 \leq q \leq 0.2$, $0.003 \leq r \leq 0.08$, $0 \leq s \leq 1$. The blue LED irradiates a fluorescent material to general yellowish light that is complementary to the blue light. The blue light and the yellowish light are then mixed using lens theory to general visible light that is white color to human eye. This can be further explained by using a so-called C.I.E. chromaticity diagram. When wavelength of light emitted by the semiconductor light-emitting component corresponds to a point on a straight line connecting point A (blue light) and point B (yellowish light) in a chromaticity diagram, light of white color can be emitted.

It is known that the white light is mixed light of different colors. The white light, which is sensed by human eye as white color, at least includes two or more colors of light having different wavelengths. For example, when human eye is stimulated, at the same time, by the Red, Green, and Blue colors of light, or by blue light and yellowish light, a white color is sensed. Accordingly, there have been three major approaches to the formation of white light for now. The first is using R/G/B LEDs. By controlling the current passing the LED to generate white light. The second is using yellow/blue LEDs to generate white light. These two prior art methods has a common drawback in that when quality of one of the plural LEDs deteriorates, an accurate white light is no longer obtained. Furthermore, using plural LEDs is costly. Another known approach is using InGaN LED, which generates blue light that. can be absorbed by fluorescent dye or powders to emit yellowish light, that is mixed with blue light to produce white light. This newly developed has no disadvantage of the former two prior art methods as described above. Besides, such LED has a simpler driving circuit and can be made by simple manufacturing process. Further, such InGaN LED has low power consumption and cost. As a result, the third approach (InGaN LED) is widely used for various white LED applications. However, so far, since most commercial InGaN type blue LED is made by using metal organic chemical vapor deposition (MOCVD), only blue LED with fixed wavelength can be obtained. There has been a strong need for providing a series of yellow light fluorescent powders capable of modulating emitted blue light wavelengths in a range of from 430 nm to 490 nm.

As disclosed in Taiwan Patent No. 1,561,77I and also in U.S. Pat. No. 5,998,925, the light color modulating method used by Nichia Chemical includes the step of adding a hetero ion. For example, when the general formula $(Y_{l-p-r}Gd_pCe_qSm_r)_3(Al_{l-s},Ga_s)_5O_{12}$ is $(Y_{l-q\ Ceq})_3Al_5O_{12}$, 546 nm yellowish light is obtained. But, after adding Gd into this formula, the resulting $(Y_{l-p-q}Gd_pCe_q)_3Al_5O_{12}$ formula can red shift the main wavelength to 556 nm.

SUMMARY OF THE INVENTION

The main objective of the invention is to provide an alternative approach to produce red shift. This is achieved by adjusting magnitude of crystal field of the host of a fluorescent material. The electron configuration of three valance Ce is $[Xe]4f^1$, wherein the 4f orbital is split by spin-orbitalal coupling into $^2F_{5/2}$ and $^2F_{7/2}$, and wherein the 5d orbital is split due to crystal field interactions. As the crystal field increases, the level of the split 5d orbital also increases. This results in the reduced energy difference between the lowest energy level of the 5d orbital and the 4f orbital of the excited $Ce^{3a+}$, thereby generating red shift of light.

In accordance with the present invention, a composition of a fluorescent material having a formula $(Y_xM_yCe_z)Al_5O_{12}$ is provided, wherein x+y=3, x, y≠0, 0<z<0.5, M is selected from the group consisting of Tb, Lu, and Yb, wherein the $(Y_xM_y)Al_5O_{12}$ is a host thereof, and Ce is an activator thereof, and wherein by adjusting the metal component of the $(Y_xM_y)Al_5O_{12}$ host of the fluorescent material, a crystal field thereof can be modulated, thereby changing wavelength of light emitted from the fluorescent material.

Other objects, advantages and novel features of the invention will become more clearly and readily apparent from the following detailed description when taken in conjunction with the accompanying drawings.

DETAILED DESCRIPTION OF THE PREFERRED EMBODIMENTS

Figure 1:
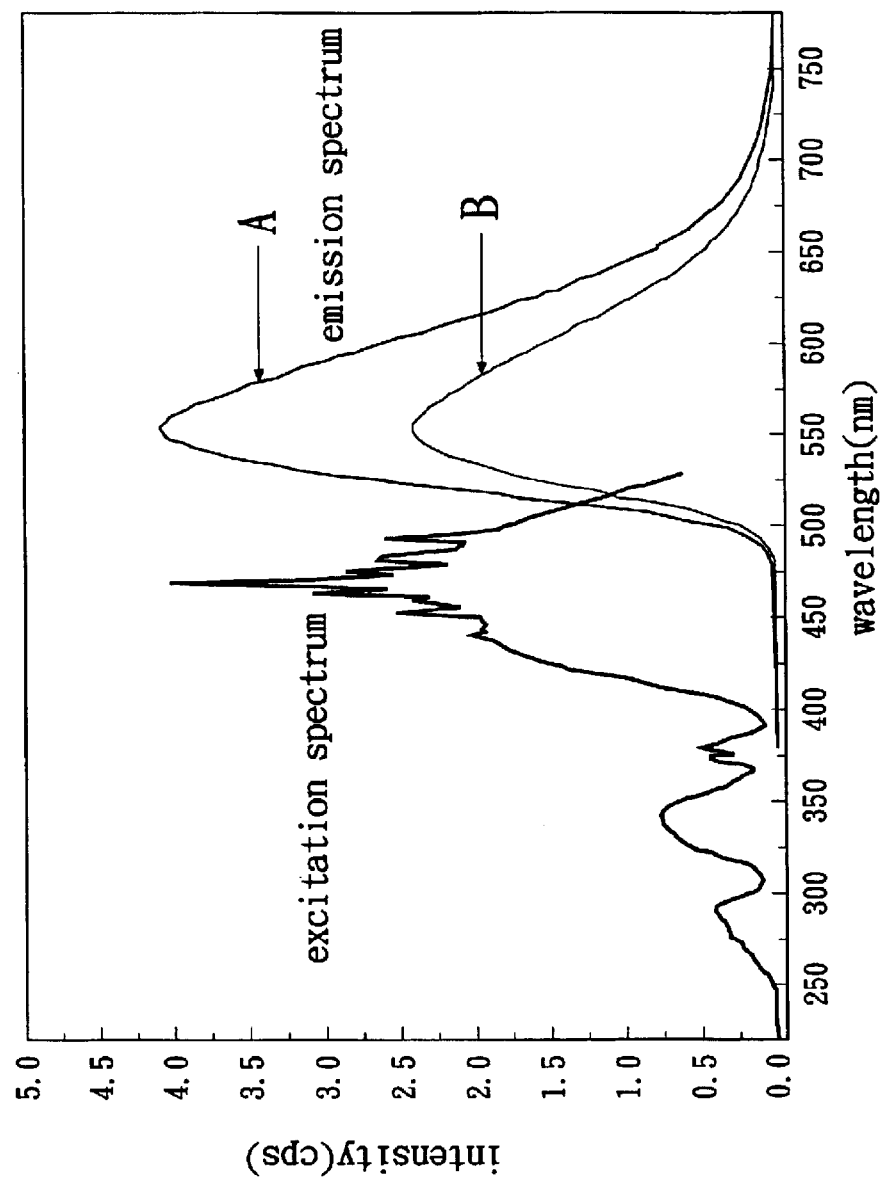
FIG. 1 illustrates respective excitation spectrum (on the left) and emission spectrum (on the right) of the synthesized powder $(Y_{1.80}Tb_{1.20}Ce_{0.05})Al_5O_{12}$ of the preferred embodiment 1, where spectrum A corresponds to 470 nm blue light excitation, spectrum B corresponds to 460 nm blue light excitation.

The present invention pertains to a method of fabricating high brightness white light emitting diodes with fluorescent powders. The fluorescent powder in accordance with one preferred embodiment has a formula $(Y_xM_yCe_z)Al_5O_{12}$, where x+y=3, x, y≠0, 0<z<0.5, M is selected from the group consisting of Tb, Lu, and Yb. According to this invention, a purple-blue light emitting diode or a blue light emitting diode is incorporated with a fluorescent powder having the above-mentioned formula $(Y_xM_yCe_z)Al_5O_{12}$, where x+y=3, x, y=≠0, 0<z<0.5, M is selected from the group consisting of Tb, Lu, and Yb, whereby generating high brightness white color light.

Now, several preferred examples embodying the present invention for preparing such fluorescent powder having the formula $(Y_xM_yCe_z)Al_5O_{12}$, and one reference example will be disclosed in details.

Preferred Embodiment 1

1. A mixture for forming a composition having a stoichiometry of $(Y_{1.80}Tb_{1.20}Ce_{0.05})Al_5O_{12}$ is prepared by mixing and grinding 3.1750 grams of $Y(NO_3)_3 6H_2O$, 8.6400 grams of $Al(NO_3)_3 9H_2O$, 0.1000 grams of $Ce(NO_3)_3 6H_2O$, and 8.6400 grams of $Tb_4O_7$.
2. The mixture of Step 1 is placed in a crucible and is calcined in air at 1000° C. with a heating rate of 5° C./min for 24 hours and followed by cooling down at a cooling rate of 5° C./min. to form intermediate powders.
3. The intermediate powders of Step 2 is again placed in a crucible and is sintered in air at 1500° C. with a heating rate of 5° C./min for 24 hours.
4. The sintered powders of Step 3 is reduced in a $H_2/N_2$ (5%/95%) reductive ambient at 1500° C. for 12 hours. This reduces $Ce^4+$ to $Ce^{33}+$. It is noted that this step, which can improve light brightness, is optional.

Preferred Embodiment 2

1. A mixture for forming a composition having a stoichiometry of $(Y_{2.375}Tb_{0.625}Ce_{0.05})Al_5O_{12}$ is prepared by mixing and grinding 4.1897 grams of $Y(NO_3)_3 6H_2O$, 8.6400 grams of $Al(NO_3)_3 9H_2O$, 0.1000 grams of $Ce(NO_3)_3 6H_2O$, and 0.2836 grams of $Tb_4O_7$.
2. The mixture of Step 1 is placed in a crucible and is calcined in air at 1000° C. with a heating rate of 5° C./min for 24 hours and followed by cooling down at a cooling rate of 5° C./min to form intermediate powders.
3. The intermediate powders of Step 2 is again placed in a crucible and is sintered in air at 1500° C. with a heating rate of 5° C./min for 24 hours.
4. The sintered powders of Step 3 is reduced in a $H_2/N_2$ (5%/95%) reductive ambient at 1500° C. for 12 hours.

Reference Example

1. A mixture for forming a reference composition having a stoichiometry of $(Y_3Ce_{0.05})Al_5O_{12}$ is prepared by mixing and grinding 5.2923 grams of $Y(NO_3)_3 6H_2O$, 8.6400 grams of $Al(NO3)_3 9H_2O$, 0.1000 grams of $Ce(NO_3)_3 6H_2O$
2. The mixture of Step 1 is placed in a crucible and is calcined in air at 1000° C. with a heating rate of 5° C./min for 24 hours and followed by cooling down at a cooling rate of 5° C./min to form intermediate powders.
3. The intermediate powders of Step 2 is again placed in a crucible and is sintered in air at 1500° C. with a heating rate of 5° C./min for 24 hours.
4. The sintered powders of Step 3 is reduced in a $H_2/N_2$ (5%/95%) reductive ambient at 1500° C. for 12 hours.

The fluorescent powders of the above three examples are all cooled down to room temperature and are ground, respectively, with mortars and pestles. The light emitting properties of these powders are analyzed by using a spectrophotometer known in the art.

Figure 2:
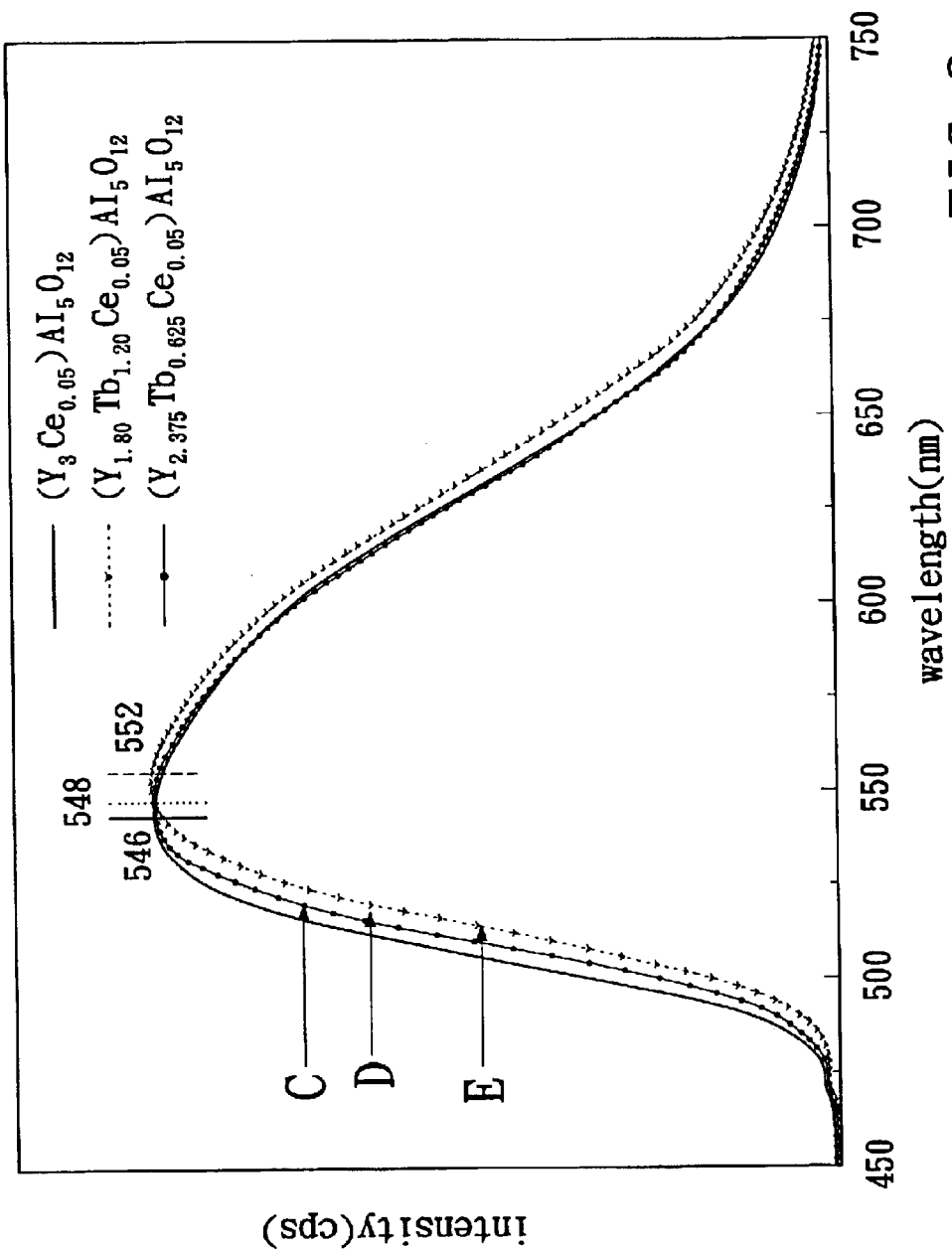
FIG. 2 is emission spectrum where spectrum C is the emission spectrum corresponding to the $(Y_3Ce_{0.05})Al_5O_{12}$ reference powder of the reference example, the spectrum represents the emission spectrum of $(Y_{2.375}Tb_{0.625}Ce_{0.05})Al_5O_{12}$ fluorescent powder of the second preferred embodiment, and spectrum E corresponds to the $(Y_{1.80}Tb_{1.20}Ce_{0.05})Al_5O_{12}$ fluorescent powder of the first preferred embodiment.
Figure 3:
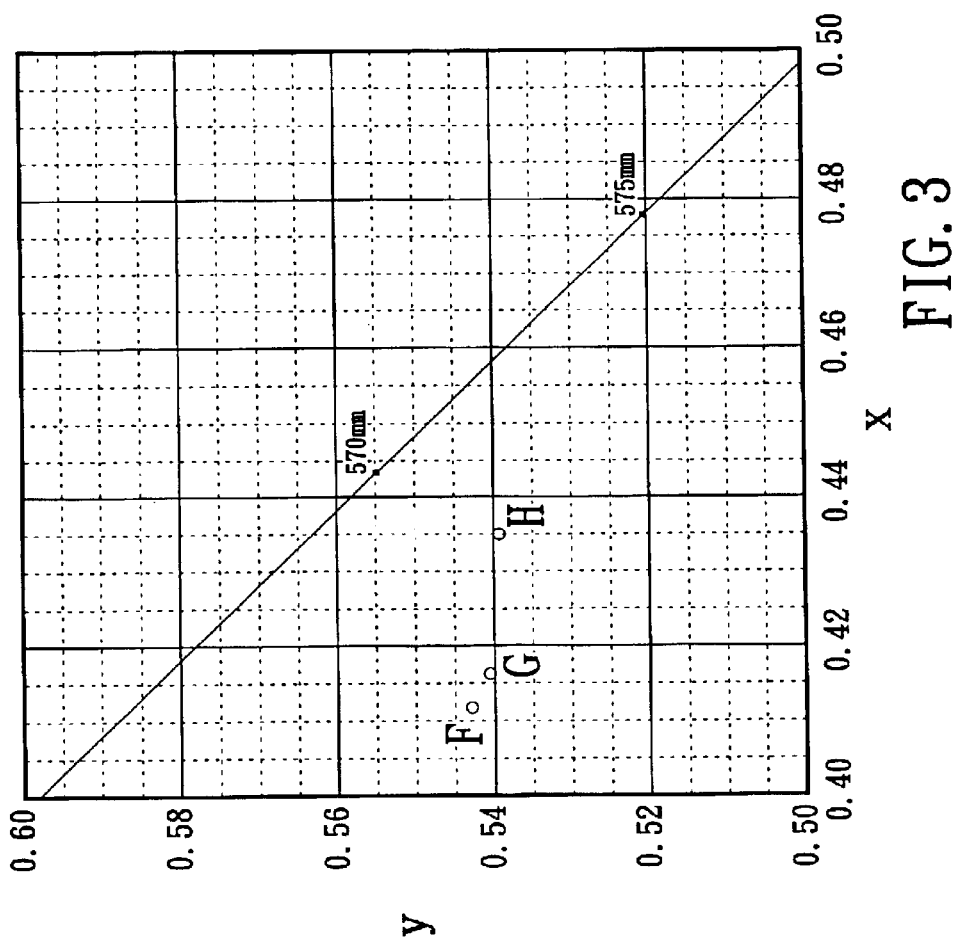
FIG. 3 illustrates red shift of the spectrum when increasing weight of Tb, where the F point presents the spectrum C in FIG. 2, the G point presents the D spectrum in FIG. 2, and the H point presents the E spectrum in FIG. 2.

Please refer to FIG. 1 to FIG. 3. FIG. 1 illustrates respective excitation spectrum (on the left) and emission spectrum (on, the right) of the synthesized powder $(Y_{1.80}Tb_{1.20}Ce_{0.05}) Al_5O_{12}$ of the preferred embodiment 1, where spectrum A corresponds to 470 nm blue light excitation, spectrum B corresponds to 460 nm blue light excitation. As shown in FIG. 1., the light efficiency of the spectrum A (470 nm light excitation) is higher than that of the spectrum B (460 nm light excitation). It is unexpectedly found that the fluorescent powder according to this invention has improved light efficiency when excited by blue light having a relatively longer wavelength.

In FIG. 2, spectrum C is the emission spectrum corresponding to the $(Y_{2.375}Tb_{0.625}Ce_{0.05})Al_5O_{12}$ reference powder of the reference example, the spectrum D represents the emission spectrum of $(Y_{2.375}Tb_{0.625}Ce_{0.05})Al_5O_{12}$ fluorescent powder of the second, preferred embodiment, and spectrum E corresponds to the $(Y_{1.80}T_{1.20}Ce_{0.05})Al_5O_{12}$ fluorescent powder of the first preferred. embodiment. As shown in FIG. 2, the reference example, $(Y_3Ce_{0.05})Al_5O_{12}$ excited by 470 nm blue light, has an emission spectrum peak at about 546nm. The second preferred embodiment, $(Y_{2.375}Tb_{0.625}Ce_{0.05})Al_5O_{12}$, has an emission spectrum peak at about 548 nm. The first preferred embodiment, $(Y_{1.80}Tb_{1.20}Ce_{0.05})Al_5O_{12}$, has an emission spectrum peak at about 552 nm. FIG. 3 illustrates red shift of the spectrum when increasing weight of Tb. It is verified from these figures that changes of the metal components of the host of the fluorescent powder can modulate crystal field of the compound and change interaction force relating to the activator, thereby resulting in changes of wavelengths.

In FIG. 3, the chromaticity diagram plotted by different Tb/Y ratio is depicted, wherein the F point presents the spectrum C in FIG. 2, the G point presents the D spectrum in FIG. 2, and the H point presents the E spectrum in FIG. 2. According to the CIE chromaticity diagram of FIG. 3, as the Tb increases, shift to long wavelength is observed.

To sum up, the present invention provides a fluorescent material $(Y_xM_yC_z)Al_5O_{12}$, where x+y=3, x, y≠0, 0<z<0.5, M is selected from the group consisting of Tb, Lu, and Yb. The host $(Y_xM_yCe_z)Al_5O_{12}$ has an activator: Ce. By changing the composition of metals in the host $(Y_xM_yCe_z)Al_5O_{12}$, it is possible to modulate the crystal field thereof, thereby altering the interaction force between the activator and the other components. This causes the different split 5d atomic orbitals of Ce. When the Ce ion is excited from its ground state (4f) to its excitation state (5d), the change of the crystal field results in the change of wavelength of the emitted photons and colors thereof.

The present invention is also directed to a white light-emitting device comprising a light emitting diode and the above-mentioned fluorescent powder. The white light-emitting device can be an excitation light source, which emits purple-blue or blue light having a domination wavelength λD range from 430 nm to 500 nm, in combination with suitable fluorescent powder that can be excited by the purple-blue or blue light emitted from the LED to generate green-yellow light to orange-yellow light having a wavelength range from 560 nm to 590 nm. The light generated by the LED and the light generated by the fluorescent powder are mixed to produce, white light.

According to the method disclosed in this application, the purple-blue or blue light is generated by low power consumption light emitting diodes in combination with a suitable fluorescent material. After packaging, a high brightness white LED with good light properties operated at very low voltage is obtained.

The fluorescent powder of this invention features its different wavelengths of the emitted light that can be obtained by simply adjusting the components of the host. The fabrication processes of the fluorescent material of this invention is simple and is thus suited for mass production.

In contrast to the prior art fluorescent material used in conventional white LED devices, the present invention has the following advantages:

1. Since the fabrication process of the shirt-wavelength blue LED is much more difficult than the fabrication process of long-wave-length blue LED, the fluorescent powder of this invention can be collocated with blue LED whose emitting light is modulated to longer wavelength. Also, according to the excitation spectrum, the light efficiency using 470 nm blue light is higher than that using 460 nm short wavelength blue light.

2. The present invention has higher reliability. According to this invention, the color of light is changed by adjusting component of host crystal. Compared to the prior art method that uses changes of hetero ion weight. This might cause undesired light color shift error introduced from the step of measuring the weight of raw materials.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A composition of a fluorescent material having a formula $(Y_xM_yCe_z)Al_5O_{12}$, where x+y=3, x, y≠0, 0<z<0.5, M is selected from the group consisting of Tb, Lu, and Yb, wherein the $(Y_xM_y)Al_5O_{12}$ is a host thereof, and Ce is an activator thereof, and wherein by adjusting the metal component of the $(Y_xM_y)Al_5O_{12}$ host of the fluorescent material, a crystal field thereof can be modulated, thereby changing wavelength of light emitted from the fluorescent material.

2. The composition of a fluorescent material as claimed in claim 1 wherein the fluorescent material is synthesized by raw powders including oxides, nitrates of metal compounds, organic metal compounds, or salts of metals.

3. The composition of a fluorescent material as claimed in claim 1 wherein the synthesis of the fluorescent material is done by using solid state sintering or chemical processes.

4. The composition of a fluorescent material as claimed in claim 3 wherein the chemical processes comprises Sol-Gel method and co-precipitation.

5. A white light emitting device comprising a fluorescent material having a formula $(Y_xM_yCe_z)Al_5O_{12}$ in combination with a light emitting diode (LED) capable of emitting light having predetermined wavelength and brightness serving as an excitation light source, and after packaging the fluorescent material and the LED and applying current thereon, light generated by the fluorescent material and light generated by the LED are mixed to form white light.

6. The white light emitting device as claimed in claim 5 wherein the formula $(Y_xM_yCe_z)Al_5O_{12}$ where x+y=3, x, y≠0, 0<z<0.5, M is selected from the group consisting of Tb, Lu, and Yb, wherein the $(Y_xM_y)Al_5O_{12}$ is a host thereof, and Ce is an activator thereof.

7. The white light emitting device as claimed in claim 5 wherein the LED emits light having a domination wavelength λD range from 430 nm to 500 nm.

8. The white light emitting device as claimed in claim 5 wherein the fluorescent material emits light having a domination wavelength λD range from 560 nm to 590 nm.

9. The white light emitting device as claimed in claim 5 wherein the mixture ratio of the fluorescent material and the wavelength and the brightness of the LED can be determined by chromaticity.

* * * * *